United States Patent [19]
Yoshida

[11] Patent Number: 5,626,686
[45] Date of Patent: May 6, 1997

[54] THIN-FILM SOLAR CELL AND METHOD OF MANUFACTURING THE SAME

[75] Inventor: Takashi Yoshida, Kanagawa, Japan

[73] Assignee: Fuji Electric Co. Ltd., Japan

[21] Appl. No.: 580,337

[22] Filed: Dec. 28, 1995

[51] Int. Cl.$^6$ ............................. H01L 31/05; H01L 31/20
[52] U.S. Cl. ............................. 136/244; 136/258; 438/80; 438/98
[58] Field of Search ............................. 136/244, 256, 136/258 AM; 437/2–5, 51

[56] References Cited

U.S. PATENT DOCUMENTS 5,268,037 12/1993 Glatfelter ............................. 136/249
5,421,908 6/1995 Yoshida et al. ............................. 136/244

Primary Examiner—Aaron Weisstuch
Attorney, Agent, or Firm—Rossi & Associates

[57] ABSTRACT

A thin-film solar cell includes an insulating flexible substrate, a plurality of photoelectric conversion regions each having a rear electrode layer, an amorphous semiconductor layer and a transparent electrode layer, formed in this order on a first surface of the substrate, and a connecting electrode layer formed on a second surface of the substrate, so as to extend over two adjacent photoelectric conversion regions. The rear electrode layer is connected with the connecting electrode layer, through extended parts thereof deposited on an inner wall of a first hole formed through the rear electrode layer, substrate and the connecting electrode layer. The amorphous semiconductor layer includes an extended portion covering a surface of a portion of the connecting electrode layer located on a periphery of the first hole. The transparent electrode layer of one of two adjacent photoelectric conversion regions is connected with the connecting electrode layer, through extended parts thereof deposited on an inner wall of a second hole formed through the transparent electrode layer, amorphous semiconductor layer, rear electrode layer, substrate and connecting electrode layer, whereby the photoelectric conversion regions are connected in direct series with each other.

5 Claims, 4 Drawing Sheets

THIN-FILM SOLAR CELL AND METHOD OF MANUFACTURING THE SAME

FIELD OF THE INVENTION

The present invention relates to a thin-film solar cell using a photoelectric conversion layer consisting of an amorphous semiconductor thin film formed on a flexible substrate, such as an insulating film, and to a method of manufacturing such a solar cell.

BACKGROUND OF THE INVENTION

Public attention has been drawn to a solar cell as clean energy source, and its technology has been remarkably developed. In particular, a thin-film solar cell using a photoelectric conversion layer made principally of amorphous silicon is expected to meet the necessary requirements, since the photoelectric conversion layer can be easily formed over a large area at a relatively low cost. A glass substrate used in a conventional thin-film solar cell is of undesirable thickness, heavy and prone to break, and there are increasing requirements for reduced thickness and reduced weight of the substrate, so as to achieve an improved work efficiency, for example, when the solar cell is installed on an outdoor roof. To meet these requirements, a flexible thin-film solar cell using a flexible plastic film or a metallic thin film as a substrate is being put to practical use.

The thin-film solar cell includes electrode layers formed on both surfaces of the photoelectric conversion layer formed on the substrate. One of the electrode layers, located on the side of light incidence, is a transparent electrode layer made of a transparent conductive material, such as ITO or ZnO. Since the transparent electrode layer has a large sheet resistance, flow of electric current through the transparent electrode layer results in increased power loss. In a conventional method, therefore, the thin-film solar cell was divided into a plurality of unit cells having a small width, and each unit cell was electrically connected to its adjacent unit cell to provide a direct series connection structure. As an improvement over this structure, the present inventor proposed a thin-film solar cell as disclosed in U.S. Pat. No. 5,421,908, in which an insulating substrate has holes formed therethrough, which are used to connect the transparent electrode layer disposed on the side of the photoelectric conversion layer remote from the substrate, with a connecting electrode layer on the rear surface of the substrate. This makes it possible to reduce the length of the path of electric current flowing through the transparent electrode layer having a high sheet resistance. Accordingly, a low-voltage, large-current type solar cell can be constructed without dividing it into a number of unit cells having limited dimensions, assuring reduced joule loss, and an increased effective power generating area due no reduction of dead space in the cell.

FIGS. 2a and 2b show a thin-film solar cell corresponding to that shown in FIG. 24 of U.S. Pat. No. 5,421,908 identified above, wherein FIG. 2a is a plane view as seen from the light incidence side of the cell, and FIG. 2b is a plane view showing the rear surface of the substrate. In the interest of clarity, a transparent electrode layer 5, a photoelectric conversion layer 4, and a connecting electrode layer 2 are shown in differently hatched or dotted areas in these figures. Two kinds of connecting holes, that is, first holes 11 and second holes 12 are formed through a flexible substrate 1 and other layers. The first holes 11 are formed through the substrate 1 prior to formation of the other layers, and serve to connect a rear electrode layer disposed between the photoelectric conversion layer 4 and the substrate 1, with the connecting electrode layer 2, by means of parts of the rear and connecting electrode layers deposited on inner walls of the holes 11. The second holes 12 are formed after formation of the rear electrode layer, and serve to connect the transparent electrode layer 5 with the connecting electrode layer 2, by means of parts of the transparent and connecting electrode layers deposited on inner walls of the holes 12. The layers on the substrate 1 are divided into four unit cells by parallel patterning lines 7, and the connecting electrode layer 2 on the rear surface of the substrate 1 is divided by patterning lines 8 which are not aligned with the patterning lines 7 on the front side of the substrate 1. In this arrangement, the unit cells are connected in direct series with each other through the first and second holes 11, 12 and the connecting electrode layer 2. In this solar cell, the photoelectric conversion layer 4 is exposed in its areas around the first holes 11, where a transparent electrode layer is not formed by use of a mask, so that the transparent electrode layer 5 is not connected with the connecting electrode layer 2 through the first holes 11.

FIG. 3 is a cross sectional view showing a thin-film solar cell as shown in FIG. 27 of U.S. Pat. No. 5,421,908. In this solar cell, a metallic electrode layer 3 is connected with a connecting electrode layer 22 on the rear surface of the substrate 1, through a printed electrode 21 embedded in each of the first holes 11. Since the metallic electrode layer 3, photoelectric conversion layer 4 and transparent electrode layer 5 are formed after the printed electrodes 21 are embedded in the first holes 11 formed through the substrate 1, the transparent electrode layer 5 is substantially insulated from the rear electrode layer 3 and printed electrode 21, due to presence of a high resistance layer of an amorphous semiconductor in the photoelectric conversion layer 4. Further, the transparent electrode layer 5 can be formed over the entire area of the major surface of the substrate 1, since the first holes 11 are closed by the printed electrodes 21. The connecting electrode layer 22 is also formed by printing, and is connected with the transparent electrode layer 5, through the thus printed electrodes 22 embedded in the second holes 12. The insulation between the printed electrodes 22 and the rear electrode layer 3 is established by the photoelectric conversion layer 4 deposited in the inner walls of the second holes 12.

In the conventional thin-film solar cell as shown in FIGS. 2a and 2b, the transparent electrode layer 5 has a width "b" of 110 mm, with respect to the width "a" of 130 mm of the substrate 1 as measured in the transverse direction in FIG. 2. The width "c" of the unit cell as measured in the vertical direction in FIG. 2 is 12 mm, and the diameter "d" of the holes 12 is 1 mm, while the width "e" of the patterning lines 7 is 200 µm. Accordingly, the effective photoelectric conversion area of the solar cell is reduced by 15.3%, due to the absence of the transparent electrode layer 5 in the vicinity of the first holes 11, and further reduced by 1.1% and 1.4% due to the second holes 12 and the patterning lines 7, respectively. Consequently, the solar cell only provides a small effective area of photoelectric conversion, which is 82% of the total area of the substrate 1, since the transparent electrode layer 5 is not formed in the vicinity of the first holes 11. Thus, the number of the holes 11 cannot be increased so as to reduce resistance loss in these holes 11.

In the structure of FIG. 3, the transparent electrode layer 5 is formed over the entire area of the substrate, causing no loss in the effective photoelectric conversion area. It is, however, difficult to fill the holes 11, 12 with the printed electrodes, and the size of these holes 11, 12 must be considerably increased so as to facilitate filling of the holes with the electrodes, which results in an increased loss of the effective photoelectric conversion area. Although it may be also considered to form the transparent electrode layer over the entire area of the substrate, and remove only parts of the electrode layer around the first holes, this method is also technically difficult to carry out.

SUMMARY OF THE INVENTION

It is therefore a first object of the present invention to provide a thin-film solar cell which can be easily manufactured, assuring a sufficiently high percentage of effective photoelectric conversion area. It is a second object to provide a method of producing such a thin-film solar cell.

The first object may be accomplished according to a first aspect of the present invention which provides a thin-film solar cell comprising: an insulating flexible substrate; a plurality of photoelectric conversion regions arranged on a first surface of the flexible substrate, each of the photoelectric conversion regions comprising a rear electrode layer, an amorphous semiconductor layer having a junction, and a transparent electrode layer, which are successively formed on the flexible substrate; and a connecting electrode layer formed on a second surface of the flexible substrate, so as to extend over two adjacent ones of the plurality of photoelectric conversion regions, the rear electrode layer of one of the photoelectric conversion regions being connected with the connecting electrode layer, through extended parts of the rear electrode layer and the connecting electrode layer which are deposited on an inner wall of a first hole formed through the rear electrode layer, the substrate and the connecting electrode layer, the amorphous semiconductor layer including a portion covering a surface of a portion of the connecting electrode layer located on a periphery of the first hole, the transparent electrode layer of one of two adjacent ones of the photoelectric conversion regions being connected with the connecting electrode layer, through extended parts of the transparent electrode layer and the connecting electrode layer which are deposited on an inner wall of a second hole formed through the transparent electrode layer, the amorphous semiconductor layer, the rear electrode layer, the substrate and the connecting electrode layer, whereby the plurality of photoelectric conversion regions are connected in direct series with each other.

In one preferred form of the above aspect of the invention, the portion of the amorphous semiconductor layer covering the surface of the portion of the connecting electrode layer located on the periphery of the first hole is connected with the amorphous semiconductor layer of the photoelectric conversion regions, through an extended part of the amorphous semiconductor layer deposited on the inner wall of the first hole.

In another preferred form of the same aspect of the invention, the connecting electrode layer comprises a first layer formed on the second surface of the flexible substrate, and a second layer superposed on the first layer, the second layer including the extended part of the connecting electrode layer deposited on the inner wall of the second hole for connection with the transparent electrode layer. The second layer is not formed on peripheries of the first holes.

The second object of the invention may be accomplished according to a second aspect of the invention, which provides a method of manufacturing a thin-film solar cell, comprising the steps of: forming a plurality of first holes through an insulating flexible substrate; forming a rear electrode layer on a first surface of the flexible substrate, and a first layer of a connecting electrode layer on a second surface of the flexible substrate, such that the rear electrode layer and the connecting electrode layer are connected with each other at extended parts thereof deposited on inner walls of the first holes; forming a plurality of second holes through the rear electrode layer, the flexible substrate and the connecting electrode layer; forming an amorphous semiconductor layer covering the rear electrode layer, and extending at least along the inner walls of the first holes onto a surface of a portion of the connecting electrode layer located on a periphery of each of the first holes; and forming a transparent electrode layer covering the amorphous semiconductor layer, and a second layer of the connecting electrode layer covering the first layer except parts thereof located on the peripheries of the first holes, the transparent electrode layer and the second layer of the connecting electrode layer being connected with each other through respective extended parts thereof deposited on inner walls of the second holes. Preferably, a dimension of the extension of the amorphous semiconductor layer on the surface of the portion of the connecting electrode layer is controlled by the diameter of the first holes.

In the conventional thin-film solar cell shown in FIG. 2, the area of the transparent electrode layer formed on the substrate is reduced as described above, since the transparent electrode layer, if formed over the entire area of the substrate, may reach the rear surface of the substrate through the first holes, and come into contact with the connecting electrode layer that is to be connected with the rear electrode layer through the first holes, whereby the transparent electrode layer and the rear electrode layer may be short-circuited. In the thin-film solar cell constructed according to the present invention, on the other hand, a portion of the amorphous semiconductor layer is formed on the periphery of the first hole on the rear surface of the substrate, covering the corresponding portion of the connecting electrode layer. In this arrangement, even if the transparent electrode layer to be formed after formation of the first holes reaches the rear surface of the substrate through the first holes, an i layer or high-resistance layer of the amorphous semiconductor layer having a junction is interposed between the connecting electrode layer and the transparent electrode layer, thus preventing short-circuiting thereof. When the amorphous semiconductor layer is formed on the front surface of the substrate by a plasma CVD method, for example, the same semiconductor layer may be easily formed on the rear surface of the substrate by applying plasma onto the rear surface of the substrate through the first hole. The outside diameter of the amorphous semiconductor layer formed on the rear surface of the substrate is linearly proportional to the diameter of the first hole, as shown in FIG. 4. Accordingly, the outside diameter of the amorphous semiconductor layer can be controlled as desired, for example, can be suitably limited so as not to reduce a contact area between the first layer and the second layer of the connecting electrode layer. The second layer of the connecting electrode layer may be formed on the first layer thereof for connection with the transparent electrode layer through the second holes, and also serves to reduce resistance loss at the first layer. This second layer of the connecting electrode layer is not formed around the first holes, and is thus prevented from entering the first holes and causing short-circuiting with the transparent electrode layer.

BRIEF DESCRIPTION OF THE DRAWINGS

The invention will be described in greater detail with reference to certain preferred embodiments thereof and the accompanying drawings, wherein:

FIG. 1b is a lower plane view of the thin-film solar cell of FIG. 1a;

FIG. 1c is a cross sectional view taken along line A—A of FIG. 1a;

FIG. 2b is a lower plane view of the thin-film solar cell of FIG. 2a;

FIG. 5b is a lower plane view of the thin-film solar cell of FIG. 5a;

FIG. 6b is a lower plane view of the thin-film solar cell of FIG. 6a.

DETAILED DESCRIPTION OF THE PREFERRED EMBODIMENTS

Figure 2A:
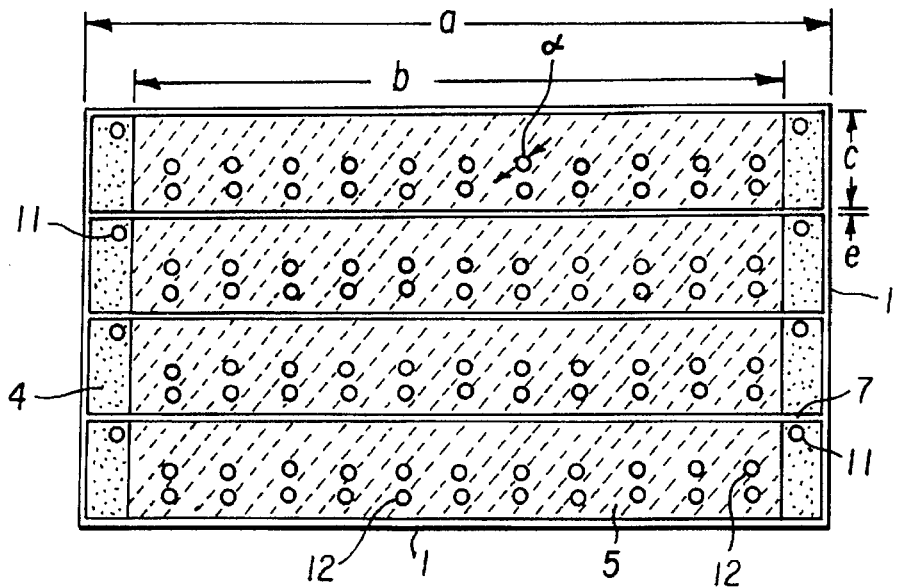
FIG. 2a is an upper plane view of a conventional thin-film solar cell.
Figure 2B:
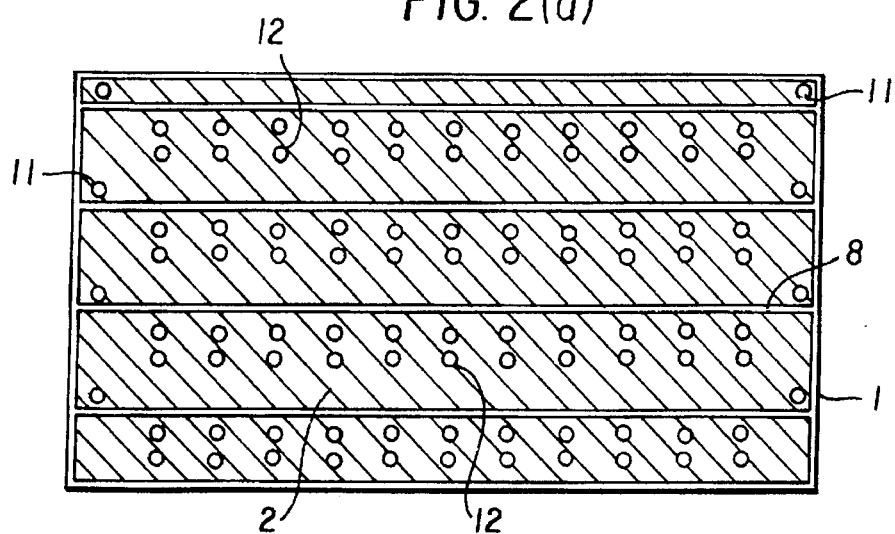
Figure 3:
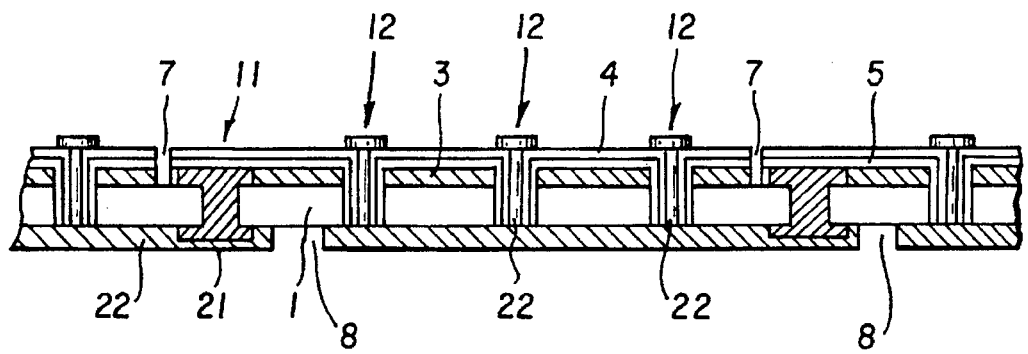
FIG. 3 is a cross sectional view showing another conventional thin-film solar cell.

There will be hereinafter described in detail one preferred embodiment of the present invention, referring to the drawings in which the same reference numerals as used in FIGS. 2a, 2b, and 3 are used to identify structurally and/or functionally corresponding elements.

Figure 1A:
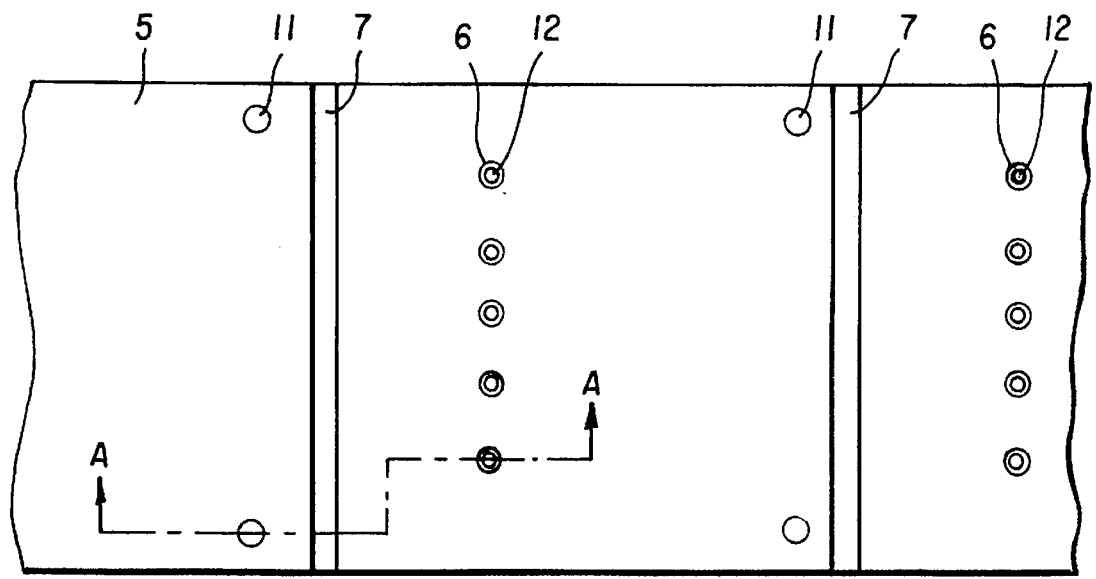
FIG. 1a is an upper plane view of a thin-film solar cell according to one embodiment of the present invention.
Figure 1B:
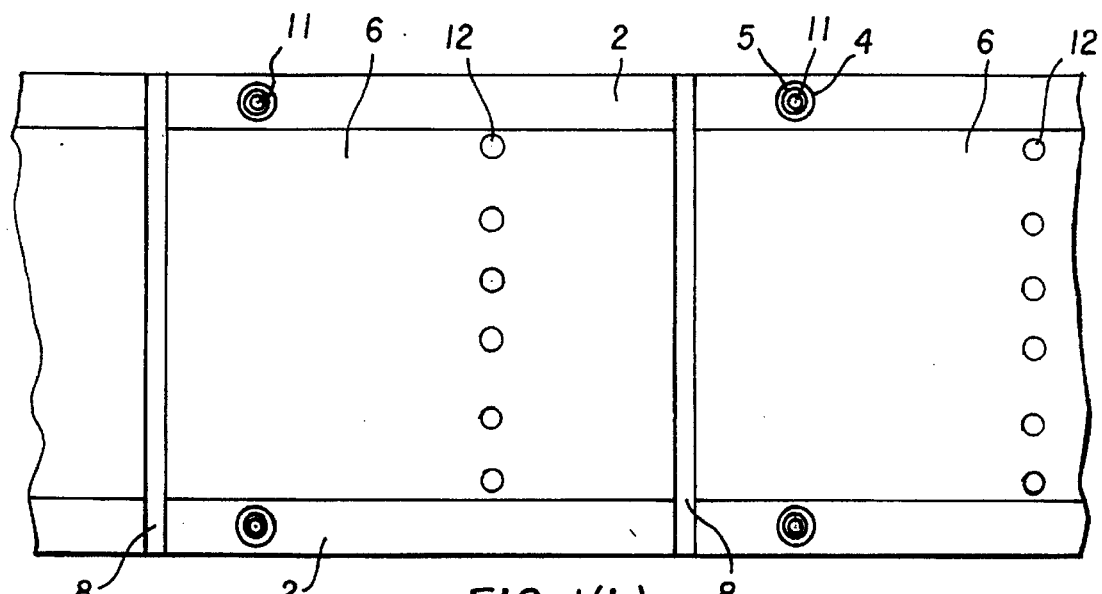
Figure 1C:
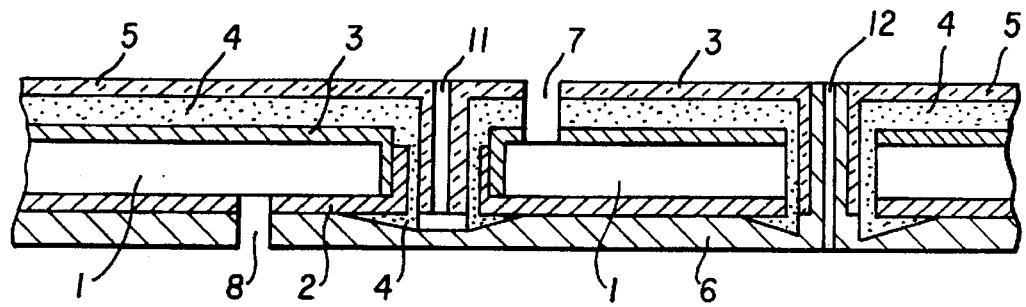

FIGS. 1a, 1b, and 1c are an upper plane view, a lower plane view, and a cross sectional view taken along line A—A in FIG. 1a, all showing one embodiment of a thin-film solar cell of the present invention. This solar cell is produced by the following method. Initially, a flexible substrate 1 having a thickness of 10 to 200 μm is formed of polyimide, Aramid, polyethylene terephthalate (PET), polyethylene naphthalate (PEN), or polyether sulphone (PES), and first holes 11 are formed through the substrate 1. Second holes 12 are then formed after a rear electrode layer 3 made of a metal is formed on the front surface of the substrate 1, and a connecting electrode layer 2 made of a metal is formed on the rear surface of the substrate 1. Thus, the rear electrode layer 3 and connecting electrode layer 2 include their extended parts formed on the inner walls of the first holes 11, but these electrode layers 3, 2 are not formed in the inside of the second holes 12. Subsequently, an amorphous semiconductor layer 4 having a p-i-n structure (junction) and made of amorphous silicon, for example, is formed on the rear electrode layer 3. This amorphous semiconductor layer 4 includes extended portions which are formed on the peripheries of the holes 11, 12 on the side of the rear surface of the substrate 1. After forming the amorphous semiconductor layer 4, a transparent electrode layer 5 is then formed. Although some parts of the transparent electrode layer are deposited on the inner walls of the holes 11, 12, the transparent electrode layer 5 and the connecting electrode layer 2 are not short-circuited due to the presence of an i layer of the amorphous semiconductor layer 4 formed on the rear surface of the substrate 1. Thereafter, an additional connecting electrode layer 6 is formed on the connecting electrode layer 2 and the amorphous semiconductor layer 4 on the rear surface of the substrate, but not formed in the vicinity of the first holes 11. This additional connecting electrode layer 6 is made of the same material as the connecting electrode layer 2, which may be selected from chromium, molybdenum, nickel, and titanium. The additional connecting electrode 6 may be selectively formed by use of a mask, or by printing, so as not to be formed around the first holes 11. Patterning lines 7 are formed to divide or split the transparent electrode layer 5, amorphous semiconductor layer 4 and rear electrode layer 3 on the surface of the substrate 1 into a plurality of photoelectric conversion regions. Patterning lines 8 are formed to divide the connecting electrode layers 2, 6 on the rear surface of the substrate 1, into a plurality of connecting regions which connect one of the photoelectric conversion regions with its adjacent photoelectric conversion region.

Figure 4:
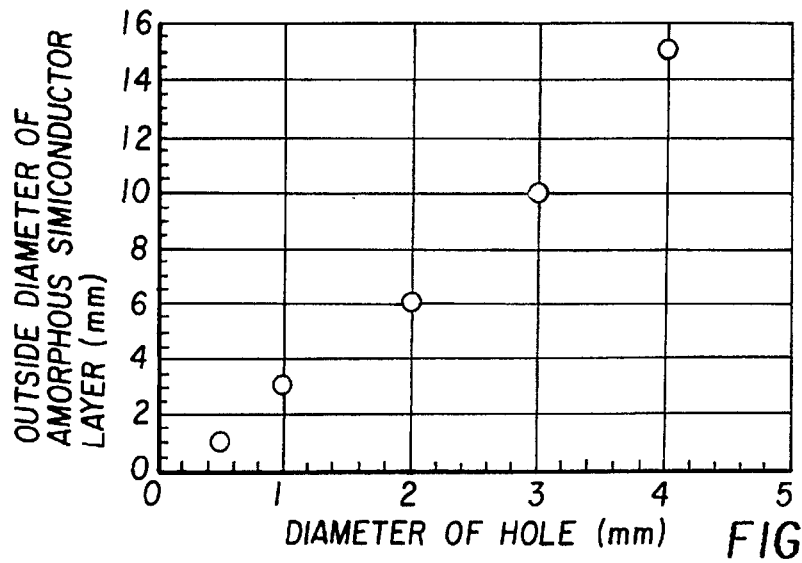
FIG. 4 is a graph indicating the relationship between the outside diameter of an amorphous semiconductor layer formed on the rear surface of a substrate, and an inside diameter of holes.
Figure 5A:
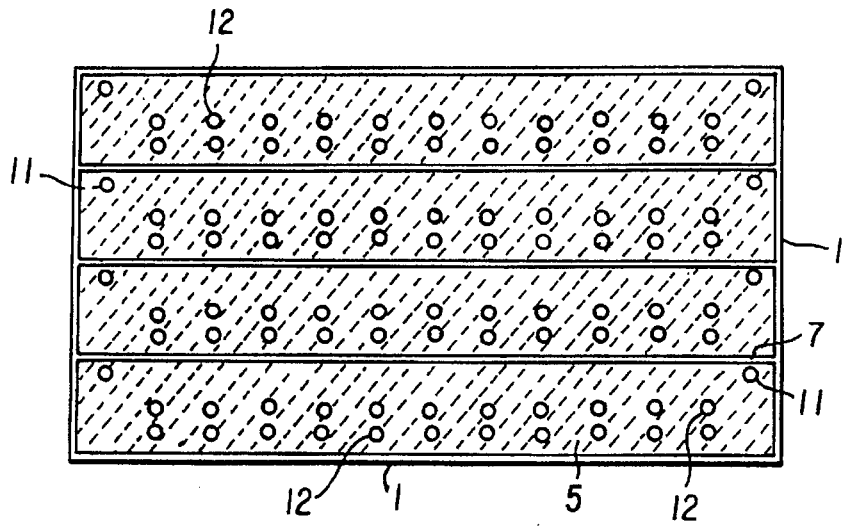
FIG. 5a is an upper plane view showing a thin-film solar cell according to another embodiment of the present invention.
Figure 5B:
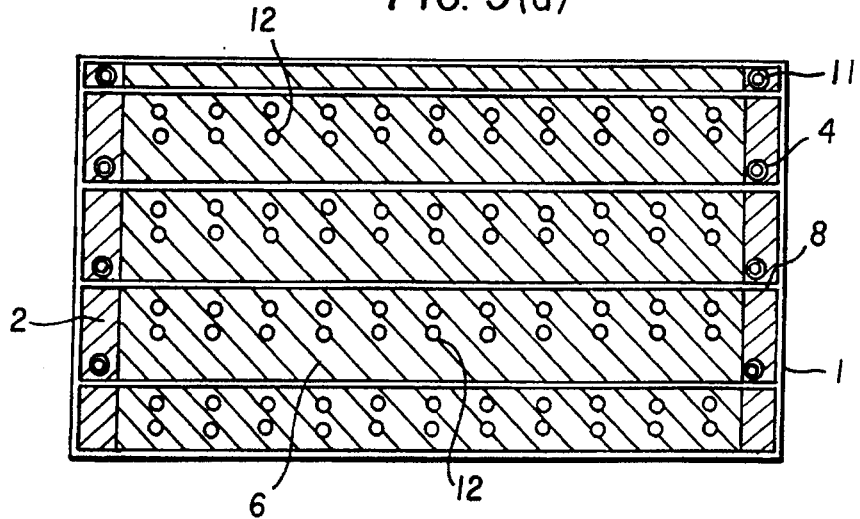

FIG. 5 shows an example of a thin-film solar cell which was produced according to the present invention, using a flexible substrate 1 having the same dimensions as that of the conventional thin-film solar cell of FIG. 2. In FIG. 5, the individual layers formed on the substrate 1 are indicated by differently hatched areas in the same manner as in FIG. 2. The unit cells of the solar cell of FIG. 5 were connected in direct series with each other in a direction perpendicular to that of the direct series connection of the solar cell of FIG. 1. As compared with the solar cell of FIG. 2 having a reduced area of the transparent electrode layer 5, the effective photoelectric conversion area of this example of FIG. 5 was increased up to 97.5%, since the amorphous semiconductor layer 4 formed on the rear surface of the substrate 1 enabled the transparent electrode layer 5 to be also formed in the vicinity of the first holes 11. In this example, 1 mm-diameter holes were formed through a 50 μm-thickness substrate, and thus the outside diameter of the amorphous semiconductor layer 4 on the rear surface of the substrate was 3 mm, as indicated in FIG. 4.

Figure 6A:
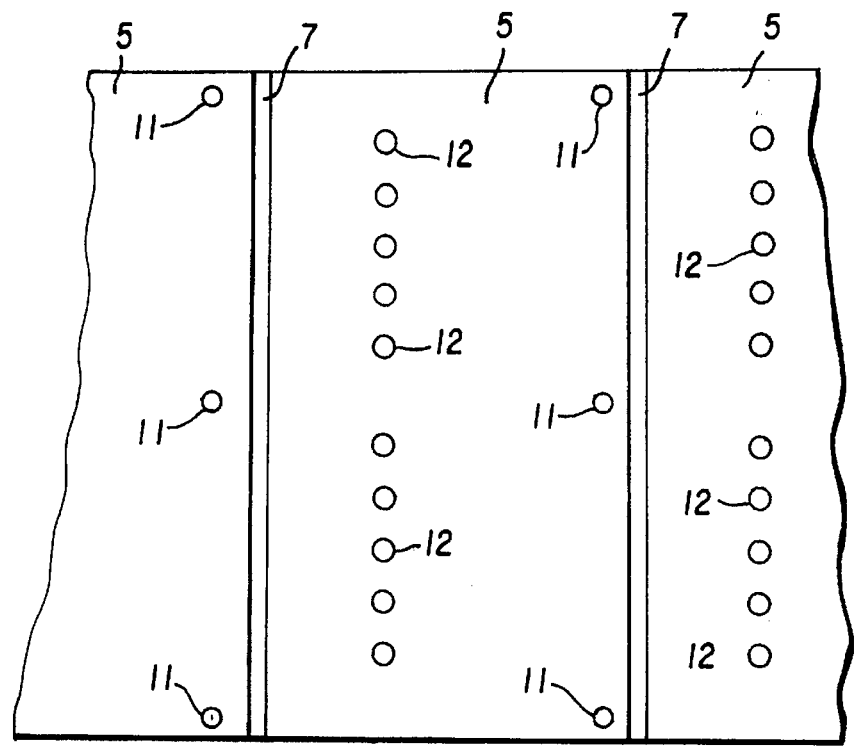
FIG. 6a is an upper plane view showing a thin-film solar cell according to a further embodiment of the present invention.
Figure 6B:
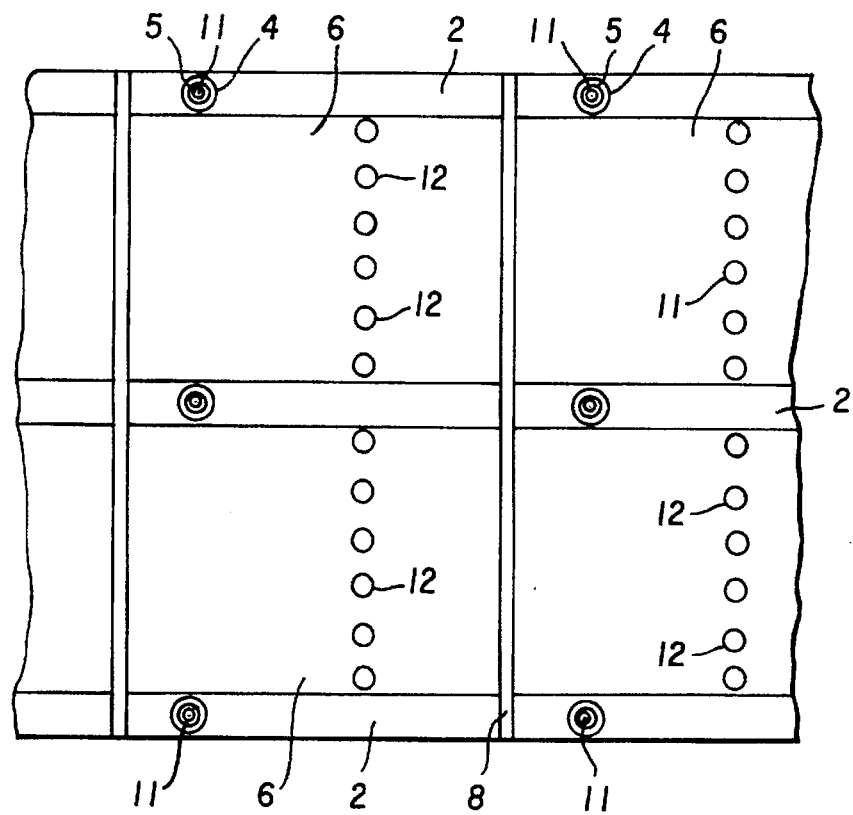

FIG. 6 shows a thin-film solar cell as another embodiment of the present invention, which is different from the cell of FIG. 1 in that three or more of first holes 11 are formed in one unit cell. While an increase in the number of the first holes 11 in the conventional cell results in a reduced effective photoelectric conversions area, the present invention permits formation of three or more first holes 11, without unfavorably reducing the effective photoelectric conversion area. With the number of the first holes 11 thus increased, the resistance loss of an electric current flowing through the rear electrode layer 3, and connecting electrode layers 2, 6 can be reduced or alleviated.

According to the present invention, extended portions of the amorphous semiconductor layer are formed on the peripheries of the first holes to cover the corresponding portions of the connecting electrode layer on the rear surface of the substrate. In this arrangement, even if the transparent electrode layer reaches the rear surface of the substrate through the first holes, there is no possibility of short-circuiting of the transparent electrode layer and the connecting electrode layer. This allows the transparent electrode layer to be formed over the entire surface area of the substrate. Consequently, the effective power generating area of the solar cell can be increased by 15% or more. With no loss of the effective power generating area, the module of the solar cell can be freely designed, to thus significantly solve some problems, such as a resistance loss of the metallic electrode. Further, the thin-film solar cell of the present invention can be easily manufactured, without involving conventional technical problems, such as filling holes with films by printing, or removing only certain parts of the transparent electrode from the amorphous semiconductor layer.

What is claimed is:

1. A thin-film solar cell comprising:

an insulating flexible substrate;

a plurality of photoelectric conversion regions arranged on a first surface of said flexible substrate, each of said photoelectric conversion regions comprising a rear electrode layer, an amorphous semiconductor layer having a junction, and a transparent electrode layer, which are successively formed on said flexible substrate; and a connecting electrode layer formed on a second surface of said flexible substrates so as to extend over two adjacent ones of said plurality of photoelectric conversion regions, said rear electrode layer of one of said photoelectric conversion regions being connected with said connecting electrode layer, through extended parts of the rear electrode layer and the connecting electrode layer which are deposited on an inner wall of a first hole formed through the rear electrode layer the substrate and the connecting electrode layer, said amorphous semiconductor layer including a portion covering a surface of a portion of said connecting electrode layer located on a periphery of said first hole, said transparent electrode layer of one of two adjacent ones of said photoelectric conversion regions being connected with said connecting electrode layer, through extended parts of the transparent electrode layer and the connecting electrode layer which are deposited on an inner wall of a second hole formed through the transparent electrode layer, the amorphous semiconductor layer, the rear electrode layer, the substrate and the connecting electrode layer, whereby said plurality of photoelectric conversion regions are connected in direct series with each other.

2. A thin-film solar cell as defined in claim 1, wherein said portion of said amorphous semiconductor layer covering said surface of said portion of said connecting electrode layer located on the periphery of said first hole is connected with said amorphous semiconductor layer of said photoelectric conversion regions, through an extended part of the amorphous semiconductor layer deposited on the inner wall of the first hole.

3. A thin-film solar cell as defined in claim 1, wherein said connecting electrode layer comprises a first layer formed on said second surface of said flexible substrate, and a second layer superposed on said first layer except at the periphery of said first hole, said second layer including said extended part of said connecting electrode layer deposited on the inner wall of said second hole for connection with said transparent electrode layer.

4. A method of manufacturing a thin-film solar cells comprising the steps of:

forming a plurality of first holes through an insulating flexible substrate;

forming a rear electrode layer on a first surface of said flexible substrate, and a first layer of a connecting electrode layer on a second surface of the flexible substrate, such that the rear electrode layer and the connecting electrode layer are connected with each other at extended parts thereof deposited on inner walls of said first holes;

forming a plurality of second holes through said rear electrode layer, said flexible substrate and said connecting electrode layer;

forming an amorphous semiconductor layer covering said rear electrode layer, and extending at least along the inner walls of the first holes onto a surface of a portion of said connecting electrode layer located on a periphery of each of the first holes; and forming a transparent electrode layer covering said amorphous semiconductor layer, and a second layer of said connecting electrode layer covering said first layer of said connecting electrode layer except parts thereof located on said peripheries of the first holes, said transparent electrode layer and said second layer of said connecting electrode layer being connected with each other through respective extended parts thereof deposited on inner walls of said second holes.

5. A method as defined in claim 4, wherein a dimension of the extension of said amorphous semiconductor layer on said surface of said portion of said first layer of said connecting electrode layer is controlled by the diameter of said first holes.

* * * * *